April 12, 1966 H. S. SOMMERS, JR 3,246,256

OSCILLATOR CIRCUIT WITH SERIES CONNECTED NEGATIVE RESISTANCE ELEMENTS FOR ENHANCED POWER OUTPUT

Original Filed July 5, 1960

INVENTOR.
HENRY S. SOMMERS, JR.
BY Eugene M. Whitacre
ATTORNEY

United States Patent Office 3,246,256

Patented Apr. 12, 1966

3,246,256

OSCILLATOR CIRCUIT WITH SERIES CONNECTED NEGATIVE RESISTANCE ELEMENTS FOR ENHANCED POWER OUTPUT

Henry S. Sommers, Jr., Princeton, N.J., assignor to Radio Corporation of America, a corporation of Delaware Continuation of application Ser. No. 40,944, July 5, 1960. This application June 8, 1964, Ser. No. 375,999

8 Claims. (Cl. 331—107)

This invention relates to negative resistance diode circuits and more particularly to negative resistance diode circuits operated as oscillation generators. This is a continuation of an application filed by H. S. Sommers, Jr. on July 5, 1960, Serial No. 40,944 and entitled Negative Resistance Oscillator.

One form of negative resistance diode, which is known as a tunnel diode, exhibits a positive resistance characteristic for very small forward bias voltages, a negative resistance characteristic for intermediate values of forward bias voltages, and a positive resistance for higher values of forward bias voltages. Stated in another manner, as the forward voltage applied to a voltage controlled negative resistance diode is continuously increased from zero, the diode current first increases to a relatively sharp maximum value, then decreases to a relatively deep and broad minimum and thereafter again increases.

When a tunnel diode is stably biased in the negative resistance region of its current-voltage characteristic by a suitable biasing source and appropriate reactive circuit means are coupled to the diode, oscillations will be sustained. The amplitude of oscillations developed will be dependent on the voltage range over which the tunnel diode exhibits a negative resistance. For typical germanium tunnel diodes, the peak voltage amplitude of this range will be approximately 0.2 volts (peak-to-peak 0.4 volts) or approximately 0.1 volt R.M.S. Since the oscillatory power developed is approximately equal to the R.M.S. voltage squared divided by the negative resistance of the diode, a low power output results. In general, an increase in the power output of a tunnel diode oscillator comes at the expense of lowering the impedance of the tunnel diode.

Accordingly, it is an object of this invention to provide an improved negative resistance diode oscillator circuit.

It is another object of this invention to provide a negative resistance diode oscillator having improved oscillatory power output capabilities.

It is a further object of this invention to provide an improved negative resistance diode oscillator circuit having an enhanced power output while at the same time exhibiting a higher impedance.

In accordance with the invention, a tunnel diode oscillator circuit includes at least two tunnel diodes connected in series. A suitable biasing source is provided to bias the diodes so that at least one of them must be biased to operate in the negative resistance region of its current-voltage characteristic. The series connected tunnel diodes are closely coupled to a common resonant circuit so that the tunnel diode which is biased in the negative resistance region drives the circuit into oscillation. Because the circuit is tightly coupled, the oscillation will settle down to a steady state with all the diodes oscillating in phase. The amplitude of oscillatory voltage developed will then be roughly "$n$" times that of a single diode oscillator circuit where "$n$" is equal to the number of diodes while the negative resistance is the sum of the negative resistances of each diode. Since the power output of the oscillator is directly proportional to the square of the output voltage and inversely proportional to impedance, an increased oscillatory power output will be developed.

Figure 1:
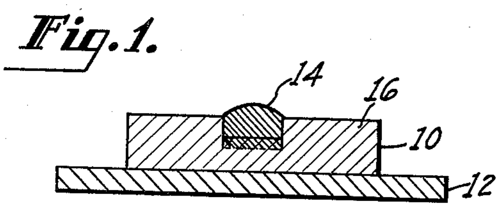
FIGURE 1 is a sectional view of a typical negative resistance diode which may be used in circuits embodying the invention.

Reference is now made to FIGURE 1 which is a diagrammatic sectional view of a typical negative resistance diode that may be used in the arrangement of the invention. By way of example, Leo Esaki, Physical Review, vol. 109, page 603, 1958, has reported a thin or abrupt junction diode exhibiting a negative resistance over a region of low forward bias voltages. The diode was prepared with a semiconductor having a free charge carrier concentration several orders of magnitude higher than that used in conventional diodes.

A diode which was constructed and could be used in practicing the invention includes a single crystal bar of n-type germanium which is doped with arsenic to have a donor concentration of $4.0 \times 10^{19}$ cm.$^{-3}$ by methods known in the semiconductor art. This may be accomplished, for example, by pulling a crystal from molten germanium containing the requisite concentration of arsenic. A wafer 10 is cut from the bar along the 111 plane, i.e., a plane perpendicular to the 111 crystallographic axis of the crystal. The wafer 10 is etched to a thickness of about 2 mils with a conventional etch solution. A major surface of this wafer 10 is soldered to a strip 12 of a conductor, such as nickel, with a conventional lead-tin-arsenic solder, to provide a non-rectifying contact between the wafer 10 and the strip 12. The nickel strip 12 serves eventually as a base lead. A small diameter dot 14 of 99 percent by weight indium, 0.5 percent of weight zinc and 0.5 percent by weight gallium is placed with a small amount of a commercial flux on the free surface 16 of the germanium wafer 10 and then heated to a temperature in the neighborhood of 450° C. for a minute in an atmosphere of dry hydrogen to alloy a portion of the dot to the free surface 16 of the wafer 10, and then cooled rapidly. In the alloying step, the unit is heated and cooled as rapidly as possible so as to produce an abrupt p–n junction. The unit is then given a final dip etch for 5 seconds in a slow iodide etch solution, followed by rinsing in distilled water. A suitable slow iodide etch is prepared by mixing one drop of a solution comprising 0.55 gram potassium iodide, and 100 cm.$^3$ water in 10 cm.$^3$ concentrated acetic acid, and 100 cm.$^3$ concentrated hydrofluoric acid. A pigtail connection may be soldered to the dot where the device is to be used at ordinary frequencies. Where the device is to be used at high frequencies, contact may be made to the dot with a suitable low impedance connection.

Other semiconductors may be used instead of germanium, particularly silicon and the III–V compounds. A III–V compound is a compound composed of an element from Group III and an element from Group V of the Periodic Table of Chemical Elements, such as gallium arsenide, indium arsenide and indium antimonide. Where III–V compounds are used, the P and N type impurities ordinarily used in those compounds are also used to form the diode described. Thus, sulfur is a suitable n-type impurity and zinc a suitable p-type impurity which is also suitable for alloying.

Figure 2:
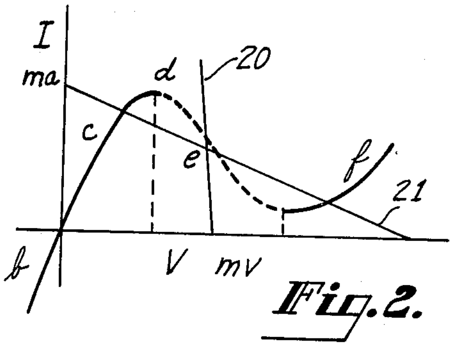
FIGURE 2 is a graph illustrating the current-voltage characteristic of a negative resistance diode of the type shown in FIGURE 1.

The current-voltage characteristic of a typical diode suitable for use with circuits embodying the invention is shown in FIGURE 2. The current scales depend on area and doping of the junction, but representative currents are in the milliampere range.

For a small voltage in the back direction, the back current of the diode increases as a function of voltage as is indicated by the region *b* of FIGURE 2.

For small forward bias voltages, the characteristic is substantially linear (FIGURE 2, region *c*). The forward current results due to quantum mechanical tunneling. At higher forward bias voltages, the forward current due to tunneling reaches a maximum (region *d*, FIGURE 2), and then begins to decrease. This drop (FIGURE 2, region *e*) reaches a minimum, and rises until eventually normal injection over the barrier becomes dominant and the characteristic turns into the usual forward behavior, region *f*, FIGURE 2).

The negative resistance of the diode is the incremental change in voltage divided by the incremental change in current, or the reciprocal slope, of the region *e* of the FIGURE 2. Biasing the diode for stable operation in the negative resistance region of its characteristic requires a suitable voltage source having a smaller internal impedance than the negative resistance of the diode. Such a voltage source has a D.C. load line 20 as indicated in FIGURE 2, which is characterized by a current-voltage relationship which has a steeper slope than the negative slope of the diode characteristic and intersects the diode characteristic at only a single point. If the voltage source has an internal resistance which is greater than the magnitude of the negative resistance of the diode, the source would have a load line 21 with a shallower slope than the negative slope of the diode characteristic as indicated in FIGURE 2 and could intersect the diode characteristic curve at three points. Under the latter condition the diode is not stably biased in the negative resistance region. This is because an incremental change in current through the diode due to transient or noise currents, or the like, produces a regenerative reaction which causes the diode to assume one of its two stable states represented by the intersection of the load line 21 with the positive resistance portions of the diode characteristic curve.

Figure 3:
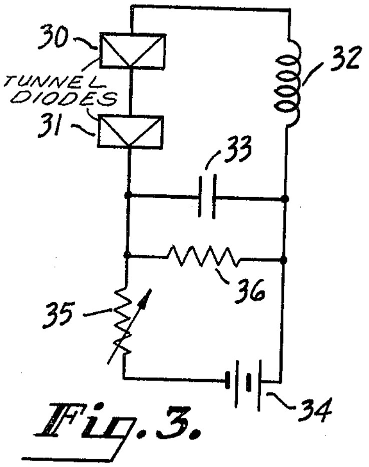
FIGURE 3 is a schematic circuit diagram of a negative resistance diode oscillator in accordance with the invention.

Referring to FIGURE 3, a negative resistance oscillator circuit in accordance with the invention includes a pair of series connected negative resistance diodes, such as tunnel diodes 30 and 31, effectively connected across an inductor 32 through a capacitor 33 which offers low impedance at the oscillator frequency. The oscillator frequency is determined by the inductance of the inductor 32 and the series capacitance of the two diodes 30 and 31.

The oscillator circuit may be coupled to a load, not shown, in any suitable manner such as by inductive coupling to the inductor 32. The biasing source for the diodes comprises a battery 34 and the series combination of a variable resistor 35 and a resistor 36 connected across the terminals of the battery. The resistor 36 is connected in parallel with the capacitor 33 so that the D.C. biasing voltage developed thereacross is applied to the series diodes 30 and 31 through the inductor 32. The variable resistor 35 is adjusted so that the voltage appearing across the resistor 36 is of a value to insure that at least one of the diodes 30 or 31 is biased to exhibit a negative resistance. The resistor 36 has a lower positive resistance than the minimum negative resistance value of either of the diodes or the combination of the two diodes, so that the susceptibility of the biasing circuit to parasitic oscillation is reduced. In addition, the low resistance of the resistor 36 insures that the D.C. load line will intersect the diode current-voltage characteristic at only a single point so that upon proper adjustment of the resistor 35 at least one of the diodes will be stably biased to exhibit a negative resistance.

The two diodes 30 and 31 can be made to oscillate in phase providing two conditions are met: (1) they must be tightly coupled in a common resonant circuit, and (2) they must be biased by the power supply so that at least one of the diodes must have an operating point in its negative resistance region. The former condition is met by minimizing lead lengths and prudent physical construction of the circuit in accordance with known techniques. The latter is met by adjusting the voltage across the resistor 36 to be greater than the sum of the voltages at the initial current maximum of the two diodes, and less than the lower of the voltages at the current minima of the diodes.

Figure 4:
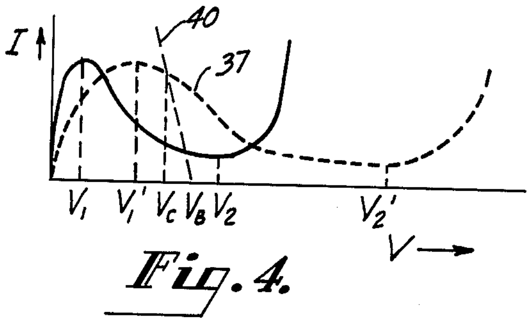
FIGURE 4 is a graph illustrating the current-voltage characteristic of a single tunnel diode as well as the composite characteristic of a pair of series connected tunnel diodes.

To better understand the biasing requirements the current-voltage characteristic of one of the tunnel diodes as well as the composite characteristic (shown dotted) of the two series connected tunnel diodes oscillating in phase, i.e. the voltage across each diode increases and decreases together, is shown in FIGURE 4. The voltage $V_c$ at the D.C. operating point is determined by the intersection of a D.C. load line 40 (determined by the biasing source resistance), with the composite tunnel diode characteristic curve 37. The voltage $V_1'$ at the initial current maximum of the composite characteristic curve is equal to the sum of the voltages $V_1$ at the initial current maximum points of the separate tunnel diodes while the broad current minimum point at voltage $V_2'$ of the composite curve is equal to the sum of the voltages at the current minimum points $V_2$ of the individual tunnel diodes.

The condition that at least one of the serial pair of tunnel diodes 30 and 31 be biased to have a D.C. operating point in the negative resistance region of its characteristic requires that the load line 40 intersect the composite characteristic at some point between voltages $V_1'$ and $V_2$, according to the inequality $V_1'<V_c<V_2$. Since the D.C. current flowing through each of the serial connected diodes 30 and 31 is the same, at least one of the diodes must have an operating point in the negative resistance region of its characteristic. This diode will begin to oscillate driving the other diode and the inductor 32. The close coupling of the diodes 30 and 31 to the resonant circuit elements results in the same oscillatory current flow through both of the diodes. At some point of the oscillating current excursions, the voltage across the diodes will become equal in magnitude and both will lock together and oscillate in phase. Loading on the diodes is adjusted to sustain oscillation, and the oscillatory voltage excursions have approximately double the excursion of a single oscillating diode while the negative resistance of the combination is substantially the sum of the negative resistances of each diode alone. Since the oscillator power output is proportional to the square of the voltage swing and inversely proportional to the diode resistance, the power output of the tunnel diode oscillator described is materially enhanced over that of an oscillator circuit using only a single tunnel diode. For simplicity of explanation, FIGURE 4 was drawn for the case where both the diodes were identical. The same type behaviour will also result under the biasing condition described when they are not identical.

If desired, more than two tunnel diodes may be connected in series in an oscillator circuit embodying the invention. If a greater number of tunnel diodes are serially connected in the oscillator circuit, the biasing voltage should be adjusted so that at least one diode has a D.C. operating point in the negative resistance portion of its characteristic. Accordingly, the number of tunnel diodes that can be connected in series in an oscillator circuit embodying the invention is limited by the inequality $nV_1<V_2$, where $n$ is the number of serially connected diodes reactively coupled together.

Figure 5:
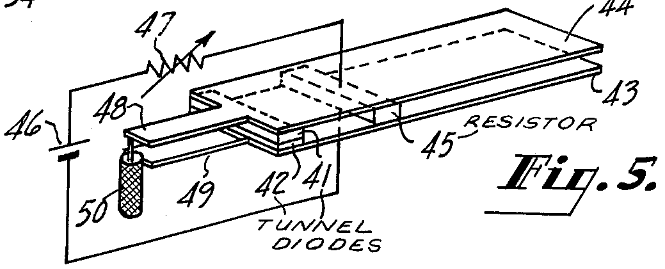
FIGURE 5 is a perspective view of a transmission line oscillator including a pair of series connected negative resistance diodes embodying the invention, with the D.C. biasing circuit shown in schematic form.

FIGURE 5 shows a transmission line negative resistance oscillator including a pair of negative resistance diodes 41 and 42. The transmission line may comprise a pair of electrically conductive strips 43 and 44 having opposed major surfaces which may be separated by suitable insulation means, not shown. The particular dimensions of the conductors 43 and 44 are selected to provide the desired frequency of resonance in the system at a predetermined characteristic impedance. The negative resistance diodes 41 and 42 are connected between the conductors 43 and 44 at one end thereof. A noninductive resistor 45, which may comprise a wafer of high conductivity germanium, is connected between the conductors 43 and 44 at a point close enough to the diodes 41 and 42 so that the intervening inductance is unimportant compared to the effective inductance of the desired mode of oscillation. Specifically, the resistor 45 is connected between the conductors 43 and 44 at a point where the standing wave voltage for the desired mode of oscillation is at a minimum and, therefore, the resistor 45 does not affect the A.C. operation of the oscillator and permits the diodes 41 and 42 to present a negative resistance to the transmission line. The biasing voltage for the diode is derived from a circuit comprising a battery 46 and a variable resistance 47 which are connected to the transmission line conductors 43 and 44 respectively at points thereon adjacent the resistor 45. The variable resistor 47 is adjusted to provide the necessary current through the resistor 45 to provide the proper voltage thereacross for biasing at least one of the diodes 41 or 42 at a point in the negative resistance region of its characteristic.

Oscillatory energy is derived from the transmission line by means of an impedance matching device comprising the parallel conductor 48 and 49 which form extensions of the transmission line conductors 43 and 44. The dimensions of the conductors 48 and 49 are selected to provide the desired impedance transformation between the resonant transmission line and a suitable load, not shown, which may be connected to a coaxial cable 50.

Figure 6:
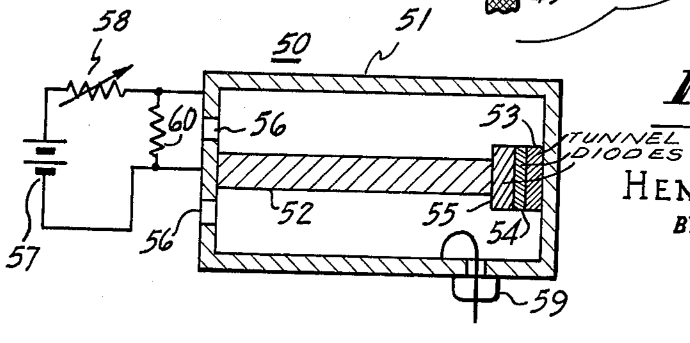
FIGURE 6 is a diagrammatic illustration of the standing wave characteristic along the transmission line portion of the oscillatory circuit shown in FIGURE 5; and, FIGURE 7 is a schematic circuit diagram of a co-axial cavity oscillator including a plurality of serially connected negative resistance diodes embodying the invention.

The standing wave pattern along the resonant transmission line and the impedance matching device is shown in FIGURE 6. The transmission line is operated in the quarter wave mode so that a voltage maximum exists near the open end thereof which decreases to a minimum at the location where the resistor 45 is connected. Thereafter the voltage increases toward the opposite end of the transmission line. This configuration has the advantage of providing a voltage step up transformation from the diodes 41 and 42 to the open end of the line thus permitting low impedance diodes to be matched to a higher impedance transmission line.

For operation, the negative resistance diodes 41 and 42 are biased so that at least one of them has an operating point in the negative resistance region by adjusting the variable resistor 47. The resistance of the resistor 45 is selected to be smaller than the negative resistance of each of the diodes 41 and 42 separately as well as of the series combination thereof. Thus the parallel combination of the diodes and the resistor 45 appear as a net positive resistance to the biasing circuit so that the susceptibility of the biasing circuit to parasitic oscillations is minimized.

Since the resistor 45 is at a voltage node point along the transmission line conductors 43 and 44 (a low impedance point), this resistor has little effect on the transmission line operation and the diodes 41 and 42 represent a negative resistance to the transmission line conductors 43 44 so that oscillations may be sustained. The transmission line can be tuned over a range of frequencies by changing the physical lengths of the conductors 43 and 44. Alternatively tuning of the oscillator may also be accomplished by terminating the open ended transmission line with a variable capacitor.

Figure 7:
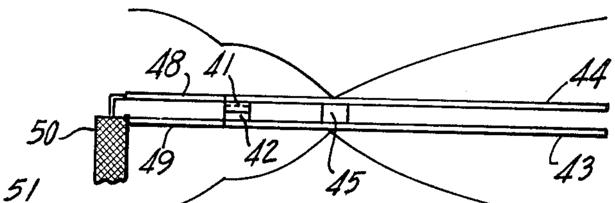

Another embodiment of the invention is shown in FIGURE 7. A coaxial cavity resonator 50, which may be made of a highly conductive material, such as copper, is constructed to resonate at the desired frequency of oscillation. The cavity resonator 50 includes an outer conductor 51, which may be cylindrical in shape, and a conductor 52 which projects internally and coaxially along the central axis of the outer conductor 51. A plurality of tunnel diodes 53, 54 and 55 are connected in series at one end of the cavity resonator 50 between the outer conductor 51 and the coaxial inner conductor 52. The other end of the conductor 52 is insulated, to D.C. voltages, from the outer conductor 51 by an annular gap 56 which may be filled with suitable dielectric material, not shown. The gap 56 functions as a capacitor with a low impedance, or a short circuit, at oscillating frequencies but provides D.C. isolation between the outer conductor 51 and the coaxial inner conductor 52. A power supply, including a battery 57 and a series variable resistor 58, is connected to the outer conductor 51 and the coaxial inner conductor 52 across the capacitive gap 56 to bias the diodes 53, 54 and 55. A coaxial cable 59 extends into the cavity of the oscillator through an aperture on the outer conductor 51 to receive oscillatory wave energy.

Parasitic oscillations in the biasing circuit may be prevented if the gap 56 has a sufficiently large capacitive reactance to damp the parasitic oscillations. Alternatively a resistor 60 may be connected across the gap 56. The resistor 60 and the capacitance of the gap 56 in combination damp the biasing circuit sufficiently to prevent parasitic oscillation from occurring therein.

In operation, the tunnel diodes are biased so that at least one of the diodes has a D.C. operating point in its negative resistance region. To accomplish this, it is sufficient that the variable resistor 58 be adjusted so that the biasing voltage $V_c$ across the diodes falls within the range of the inequality $nV_1<V_c<V_2$ where, as previously defined, $n$ equals the number of serially connected diodes (in this case 3), $V_1$ equals the voltage $V_1$ of the current maximum of the diode with largest value of $V_1$, and $V_2$ equals the voltage $V_2$ at the current minimum of the diode with the smallest value of $V_2$. The diodes 33, 34 and 35 must, with these conditions, divide the biasing voltage $V_c$ such that at least one is biased in the negative resistance region of its characteristic. This diode will begin oscillating at approximately the resonant frequency of the cavity resonator 50 and drive the other diodes into oscillation. The amplitude of oscillatory voltage excursions of the three diodes oscillating in phase will be approximately three times that of a single diode. Where the diodes are not identical, the voltage $V_1$ at the initial current maximum point of each diode may be different. In this case, a sufficient condition for oscillation is $$\sum_n V_1<V_c<V_2$$

where $$\sum_n V_1$$

means the sum of the voltages of each diode at the initial current maximum points.

What is claimed is:

1. An oscillation generator comprising in combination a plurality of serially connected negative resistance devices, reactive circuit means coupled across said serially connected negative resistance devices to provide a resonant circuit, and means providing a biasing source coupled across said plurality of negative resistance devices to bias at least one of said devices in the negative resistance portion of its characteristic, said bias means including a single resistor connected across said serially connected negative resistance devices and having a positive resistance the absolute value of which is less than the absolute value of negative resistance exhibited by any of said negative resistance devices.

2. An oscillation generator comprising in combination a pair of serially connected negative resistance diodes, reactive circuit means coupled across said diodes to provide a resonant circuit, said diodes and said reactive circuit means being closely coupled so that said diodes will oscillate in phase, a power supply circuit direct current conductively coupled across said negative resistance diodes and adapted to bias at least one of said negative resistance diodes to exhibit a negative resistance, said power supply circuit including resistive circuit means having only a pair of terminals each coupled to a different one of said pair of serially connected negative resistance diodes, said resistive circuit means having an absolute value of positive resistance which is less than the absolute value of negative resistance exhibited by either of said diodes.

3. An oscillation generator comprising a plurality of negative resistance diodes connected in series, reactive circuit means comprising an inductor connected in parallel across the series combination of said diodes to form a resonant circuit, and means providing a power supply circuit coupled across said diodes and adapted to bias at least one of said diodes to exhibit a negative resistance, said power supply circuit means including a single shunt resistor having an absolute value of positive resistance that is less than the absolute value of negative resistance exhibited by any of said negative resistance diodes.

4. An oscillation generator comprising at least a pair of voltage controlled negative resistance diodes, an inductor, means connecting said diodes and said inductor in a closely coupled series loop configuration, the resonant frequency of said loop being a function of the series combination of the interelectrode capacitances of said diodes and the inductance of said inductor, a power supply circuit including a single resistor having an absolute value of positive resistance that is less than the absolute value of negative resistance exhibited by either one of said negative resistance diodes, means connecting said resistor across said diodes to bias said diodes so that at least one of said diodes exhibits a negative resistance.

5. An oscillation generator comprising a plurality of serially connected negative resistance diodes, each of said diodes having an initial current maximum at a first voltage and a current minimum at a second voltage, said negative resistance region of each of said diodes falling between said first and second voltages, means providing a biasing source connected across said serially connected diodes to apply a biasing voltage which is greater in magnitude than the sum of the values of said first voltages for all of said diodes but less than the lowest value of said second voltage for any of said diodes, said biasing means including a single resistor connected in shunt across said plurality of serially connected negative resistance diodes, and reactive circuit means coupled across said serially connected diodes to provide a resonant circuit whereby said oscillation generator will oscillate over a voltage range dependent on the sum of said negative resistance regions of said plurality of diodes.

6. An oscillation generator comprising in combination a plurality of negative resistance diodes, an alternating current circuit including a pair of parallel conductors constructed to comprise a transmission line, said diodes connected in series between said conductors at one end of the transmission line, said conductors being open at the other end of the transmission line to operate in the quarter wave mode, and biasing means including a single resistor connected to said conductors at a voltage node point on the transmission line to bias said diodes so that at least one of said diodes is biased in its negative resistance region.

7. An oscillation generator comprising in combination a resonant transmission line including a pair of conductors, a plurality of negative resistance diodes, means connecting said diodes in series betwen said conductors at one end of said transmission line, said transmission line being open at the other end and having a voltage node point one quarter of a wave length from the open end, a biasing supply for biasing said plurality of diodes so that at least one of said diodes is biased in the negative resistance region of its current-voltage characteristic, said biasing supply including the series combination of a voltage source and a variable resistor, non-inductive resistive means having only two terminals each connected to a different one of said conductors of said transmission line at the voltage node point, said resistive means having a positive resistance value smaller than the absolute value of the negative resistance of any of said diodes, and means connecting said voltage source and said variable resistor to said resistive means in the vicinity of the voltage node point of said transmission line.

8. An oscillation generator comprising in combination a plurality of negative resistance diodes, a cavity resonator having an outer conductor and a coaxial inner conductor, means for mounting said plurality of diodes in series within said resonator between said inner conductor and said outer conductor, said cavity resonator having an annular gap at one end thereof, to isolate said inner conductor from said outer conductor for direct current, a biasing supply including the series combination of a voltage source, a variable resistor and a fixed resistor, means for connecting said fixed resistor to said inner and outer conductors across said annular gap for biasing said diodes, said diodes each having an initial current maximum at a first voltage and a current minimum at a second voltage, said variable resistor being adjusted so that said biasing supply biases said plurality of series diodes at a voltage value that is greater than the value of the voltage equal to the sum of the first voltages of all the diodes but less than the value of said second voltage whereby at least one of said diodes must be biased in the negative resistance region of its current-voltage characteristic.

References Cited by the Examiner

UNITED STATES PATENTS

| | | | |
|---|---|---|---|
| 3,019,981 | 2/1962 | Lewin | 307—88.5 |
| 3,069,564 | 12/1962 | De Lange | 307—88.5 |
| 3,112,454 | 11/1963 | Steinhoff | 307—88.5 |
| 3,127,567 | 3/1964 | Chang | 330—34 |
| 3,127,574 | 3/1964 | Sommers | 331—107 |
| 3,134,949 | 5/1964 | Tiemann | 307—88.5 |

OTHER REFERENCES

Hines et al.: 1960 International Solid-State Circuits Conference-Digest of Tech. Papers. Feb. 10, 1960, pages 12, 13.

Reich et al.: Microwave Theory and Techniques, New York. D. Van Nostrand, 1953, pages 464–468.

Sommers: "Tunnel Diodes as High Frequency Devices," Proc. of the I.R.E., July 1959, pages 1201–1206.

ROY LAKE, *Primary Examiner.*